US006436788B1

(12) United States Patent
Lee et al.

(10) Patent No.: US 6,436,788 B1
(45) **Date of Patent: *Aug. 20, 2002**

(54) FIELD EMISSION DISPLAY HAVING REDUCED OPTICAL SENSITIVITY AND METHOD

(75) Inventors: John K. Lee, Meridian; Behnam Moradi, Boise, both of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/126,695

(22) Filed: Jul. 30, 1998

(51) Int. Cl.[7] .................................... H01L 21/76

(52) U.S. Cl. ..................... 438/414; 438/20; 438/139; 313/495; 313/309

(58) Field of Search ..................... 438/20, 139, 414, 438/545; 313/495, 309

(56) References Cited

U.S. PATENT DOCUMENTS

| | | | | |
|---|---|---|---|---|
| 4,684,413 A | * | 8/1987 | Goodman et al. | 437/17 |
| 5,151,061 A | | 9/1992 | Sandhu | 445/24 |
| 5,186,670 A | | 2/1993 | Doan et al. | 445/24 |
| 5,210,472 A | | 5/1993 | Casper et al. | 315/349 |
| 5,410,218 A | | 4/1995 | Hush | 315/169.1 |
| 5,585,301 A | * | 12/1996 | Lee et al. | 437/60 |
| 5,712,534 A | | 1/1998 | Lee et al. | 315/169.3 |
| 5,780,960 A | | 7/1998 | Vickers | 313/310 |
| 5,938,493 A | | 8/1999 | Vickers | 445/24 |
| 5,940,052 A | | 8/1999 | Xia et al. | 345/74 |
| 5,952,772 A | | 9/1999 | Fox et al. | 313/310 |
| 6,000,980 A | | 12/1999 | Baldi et al. | 445/24 |
| 6,028,322 A | | 2/2000 | Moradi | 257/10 |
| 6,034,480 A | | 3/2000 | Browning et al. | 315/169.1 |
| 6,069,599 A | | 5/2000 | Py et al. | 345/74 |
| 6,278,229 B1 | * | 8/2001 | Moradi et al. | 313/309 |

OTHER PUBLICATIONS

Chalamala, Babu R. et al., "Fed Up With Fat Tubes," *IEEE Spectrum*, Apr. 1998, pp. 42–51.

* cited by examiner

*Primary Examiner*—Nimeshkumar D. Patel
*Assistant Examiner*—Kevin Quarterman
(74) *Attorney, Agent, or Firm*—Dorsey & Whitney LLP

(57) ABSTRACT

An emitter substructure and methods for manufacturing the substructure are described. A substrate has a p-region formed at a surface of the substrate. A n-tank is formed such that the p-region surrounds a periphery of the n-tank. An emitter is formed on and electrically coupled to the n-tank. A dielectric layer is formed on the substrate that includes an opening surrounding the emitter. An extraction grid is formed on the dielectric layer. The extraction grid includes an opening surrounding and in close proximity to a tip of the emitter. An insulating region is formed at a lower boundary of the n-tank. The insulating region electrically isolates the emitter and the n-tank along at least a portion of the lower boundary beneath the opening. The insulating region thus functions to displace a depletion region associated with a boundary between the p-region and the n-tank from an area that can be illuminated by photons traveling through the extraction grid or openings in the extraction grid. This reduces distortion in field emission displays.

12 Claims, 5 Drawing Sheets

FIELD EMISSION DISPLAY HAVING REDUCED OPTICAL SENSITIVITY AND METHOD

GOVERNMENT RIGHTS

This invention was made with government support under Contract No. DABT63-93-C-0025 awarded by Advanced Research Projects Agency (ARPA). The government has certain rights in this invention.

TECHNICAL FIELD

This invention relates in general to visual displays for electronic devices and more particularly to an improved emitter substructure for active matrix field emission displays.

BACKGROUND OF THE INVENTION

FIG. 1 is a simplified side cross-sectional view of a portion of a display 10 including a faceplate 20 and a baseplate 21 in accordance with the prior art. FIG. 1 is not drawn to scale. The faceplate 20 includes a transparent viewing screen 22, a transparent conductive layer 24 and a cathodoluminescent layer 26. The transparent viewing screen 22 supports the layers 24 and 26, acts as a viewing surface and as a wall for a hermetically sealed package formed between the viewing screen 22 and the baseplate 21. The viewing screen 22 may be formed from glass. The transparent conductive layer 24 may be formed from indium tin oxide. The cathodoluminescent layer 26 may be segmented into pixels yielding different colors for color displays. Materials useful as cathodoluminescent materials in the cathodoluminescent layer 26 include $Y_2O_3$:Eu (red, phosphor P-56), $Y_3$(Al, Ga)$_5O_{12}$:Tb (green, phosphor P-53) and $Y_2(SiO_5)$:Ce (blue, phosphor P-47) available from Osram Sylvania of Towanda Pa. or from Nichia of Japan.

The baseplate 21 includes emitters 30 formed on a planar surface of a semiconductor substrate 32. The substrate 32 is coated with a dielectric layer 34. In one embodiment, this is effected by deposition of silicon dioxide via a conventional TEOS process. The dielectric layer 34 is formed to have a thickness, measured in a direction perpendicular to a surface of the substrate 32 as indicated by direction arrow 36, that is approximately equal to or just less than a height of the emitters 30. This thickness is on the order of 0.4 microns, although greater or lesser thicknesses may be employed. An extraction grid 38 comprising a conductive material is formed on the dielectric layer 34. The extraction grid 38 may be realized, for example, as a thin layer of polysilicon. The radius of an opening 40 created in the extraction grid 38, which is also approximately the separation of the extraction grid 38 from the tip of the emitter 30, is about 0.4 microns, although larger or smaller openings 40 may also be employed. This separation is defined herein to mean being "in close proximity."

Another dielectric layer 42 is formed on the extraction grid 38. A chemical isolation layer 44, such as titanium, is formed on the dielectric layer 42. A soft X-ray blocking layer 46, such as tungsten, is formed on the chemical isolation layer 44 for reasons that will be explained below.

The baseplate 21 also includes a field effect transistor ("FET") 50 formed in the surface of the substrate 32 for controlling the supply of electrons to the emitter 30. The FET 50 includes an n-tank 52 formed in the surface of the substrate 32 beneath the emitter 30. The n-tank 52 serves as a drain for the FET 50, and may be formed via conventional masking and ion implantation processes. The FET 50 also includes a source 54 and a gate electrode 56. The gate electrode 56 is separated from the substrate 32 by a gate oxide layer 57 and a field oxide layer 58.

The substrate 32 may be formed from p-type silicon material having an acceptor concentration $N_A$ ca. $1–5\times10^{15}/cm^3$, while the n-tank 52 may have a surface donor concentration $N_D$ ca. $1–2\times10^{16}/cm^3$. A depletion region 60 is formed at a p-n junction between the n-tank 52 and the p-type substrate 32. The depletion region 60 provides electrical isolation from other circuitry contained on or integrated in the substrate 32. These values for the acceptor and donor concentrations allow the FET 50 to operate at the voltages required for displays 10 and provides a higher avalanche breakdown voltage than would be provided by, e.g., transistors used in conventional CMOS logic circuitry. The capacitance of the depletion region 60 is reduced compared to that of conventional logic circuitry because the doping levels are less and the operating voltages are higher, resulting in a larger depletion region 60 than would exist for transistors used in conventional logic circuitry. This provides increased electrical isolation of the FET 50 from other circuitry integrated into the substrate 32, compared to transistors used in conventional logic circuitry.

In operation, the extraction grid 38 is biased to a voltage on the order of 40–80 volts, although higher or lower voltages may be used, while the substrate 32 is maintained at a voltage of about zero volts. Signals coupled to the gate 56 of the FET 50 turn the FET 50 on, allowing electrons to flow from the source 54 to the n-tank 52 and thus to the emitter 30. Intense electrical fields between the emitter 30 and the extraction grid 38 then cause field emission of electrons from the emitter 30. A larger positive voltage, ranging up to as much as 5,000 volts or more but often 2,500 volts or less, is applied to the faceplate 20 via the transparent conductive layer 24. The electrons emitted from the emitter 30 are accelerated to the faceplate 20 by this voltage and strike the cathodoluminescent layer 26. This causes light emission in selected areas, i.e., those areas adjacent to where the FETs 50 are conducting, and forms luminous images such as text, pictures and the like. Integrating the FETs 50 in the substrate 32 to provide an active display 10 yields advantages in size, simplicity and ease of interconnection of the display 10 to other electronic componentry.

Visible photons from the cathodoluminescent layer 26 and photons that travel through the faceplate 20 can also travel back through the openings 40. When photons travel through portions of the extraction grid 38 that are exposed by the openings 40 and impinge on the depletion region 60, electron-hole pairs are generated. When electron-hole pairs are produced within the depletion region 60 associated with the p-n junction between the n-tank 52 and the p-type substrate 32, the electrons and holes are efficiently separated by the electrical fields associated with the depletion region 60. The electrons are swept into the n-tank 52 and the holes are swept into the p-type substrate 32 surrounding the n-tank 52. The electrons provide an undesirable component to electrons emitted by the emitter 30. This results in distortion in the images produced by the display 10.

For example, a blue pixel emitting blue light could provide a photon that reaches semiconductor material underlying the emitter 30 associated with an adjacent red pixel, which is not intended to be emitting light. This may cause an emitter current component resulting in an anode current in the red pixel, thus providing unwanted red light and thereby distorting the color intended to be displayed.

Alternatively, an area intended to be a dark area in the display 10 may emit light when that area is exposed to high ambient light conditions. These effects are undesirable and tend to reduce display dynamic range in addition to distorting the intended image.

There is therefore a need for a way to render p-n junctions associated with monolithic emitters less sensitive to incident photons for use in field emission displays.

SUMMARY OF THE INVENTION

Various aspects of the present invention include an emitter substrate and methods for manufacturing the substrate as well as displays incorporating the substrate and a computer using the substrate. The inventive substrate includes a semiconductor material of one type in which a tank of the opposite type semiconductor material is formed. An emitter is formed on and electrically coupled to the tank. An insulating region is formed at a lower boundary of the tank. The insulating region electrically isolates the emitter and the tank along at least a portion of the lower boundary. As a result, a depletion region associated with a boundary between the substrate material and the tank is displaced from that area where photons may impinge. This reduces distortion in the display.

DETAILED DESCRIPTION OF THE INVENTION

Figure 1:
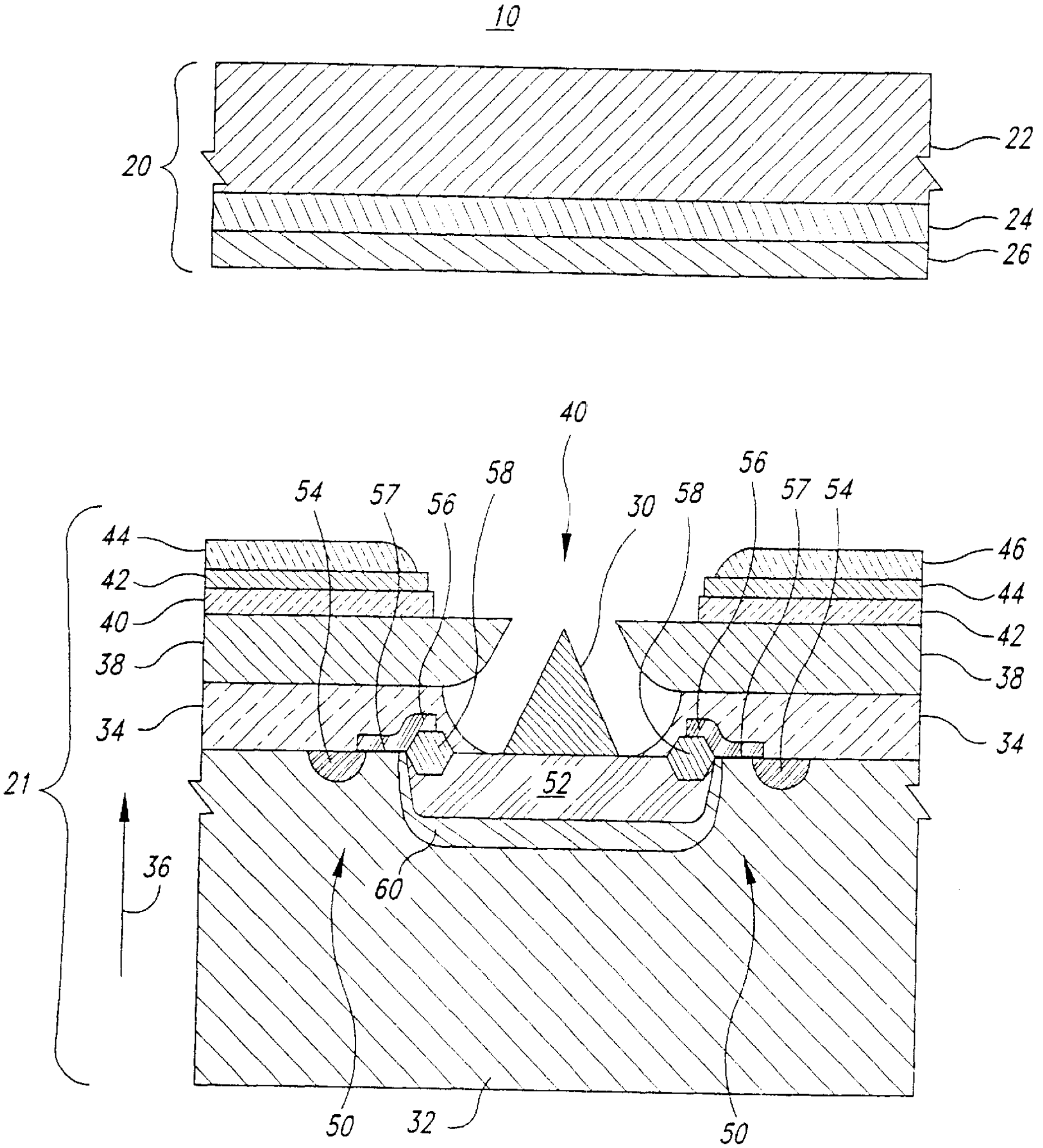
Fig. 1 (PRIOR ART)
FIG. 1 is a simplified side cross-sectional view of a portion of a display including a faceplate and a baseplate in accordance with the prior art.
Figure 2:
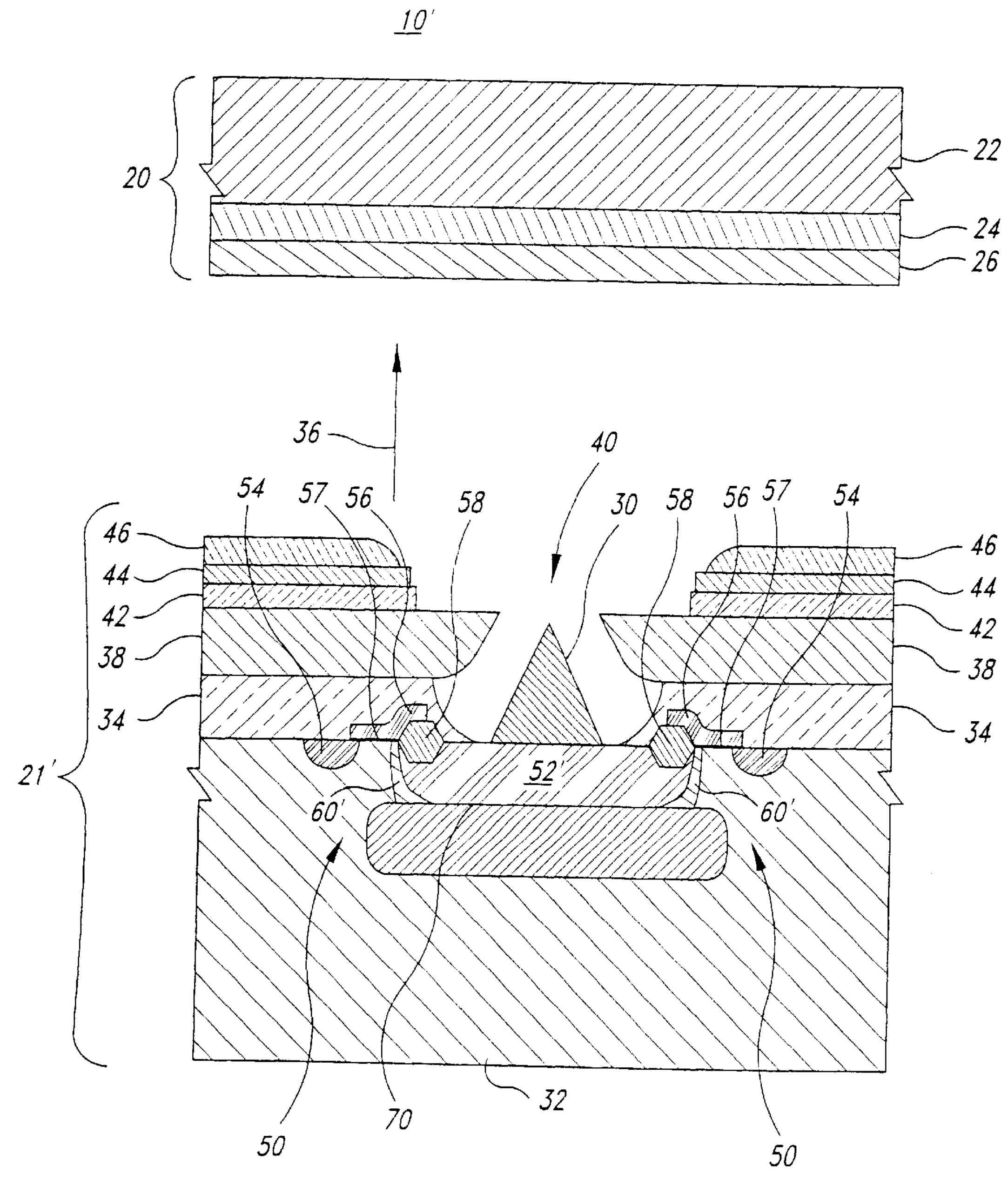
FIG. 2 is a simplified side cross-sectional view of a portion of a display according to one embodiment of the present invention.

FIG. 2 is a simplified side cross-sectional view of a portion of a display 10' according to one embodiment of the present invention. FIG. 2 is not drawn to scale. Many of the components used in the display 10' shown in FIG. 2 are identical to components used in the display 10 of FIG. 1. Therefore, in the interest of brevity, these components have been provided with the same reference numerals, and an explanation of them will not be repeated.

It has been discovered that forming an insulating region 70 under the emitter 30 and n-tank 52' displaces a depletion region 60' between the n-tank 52' and the p-type substrate 32 from the area that can be illuminated by photons traveling through the openings 40 or through portions of the extraction grid 38 that are exposed by the openings 40 in the high atomic mass layer 46, the chemical isolation layer 44 and the dielectric layer 42. In the embodiment of FIG. 2, the insulating region 70 abuts at least a lower portion of the n-tank 52' that is beneath the opening 40. By displacing the depletion region 60' from the area that can be illuminated via the opening 40 in the extraction grid 38 or through portions of the extraction grid 38 that are exposed by the openings 40 in the high atomic mass layer 46, the chemical isolation layer 44 and the dielectric layer 42, one mechanism for photo-generation of unwanted currents through the emitter 30 is reduced or removed. This results in an improved baseplate 21'.

Figure 3:
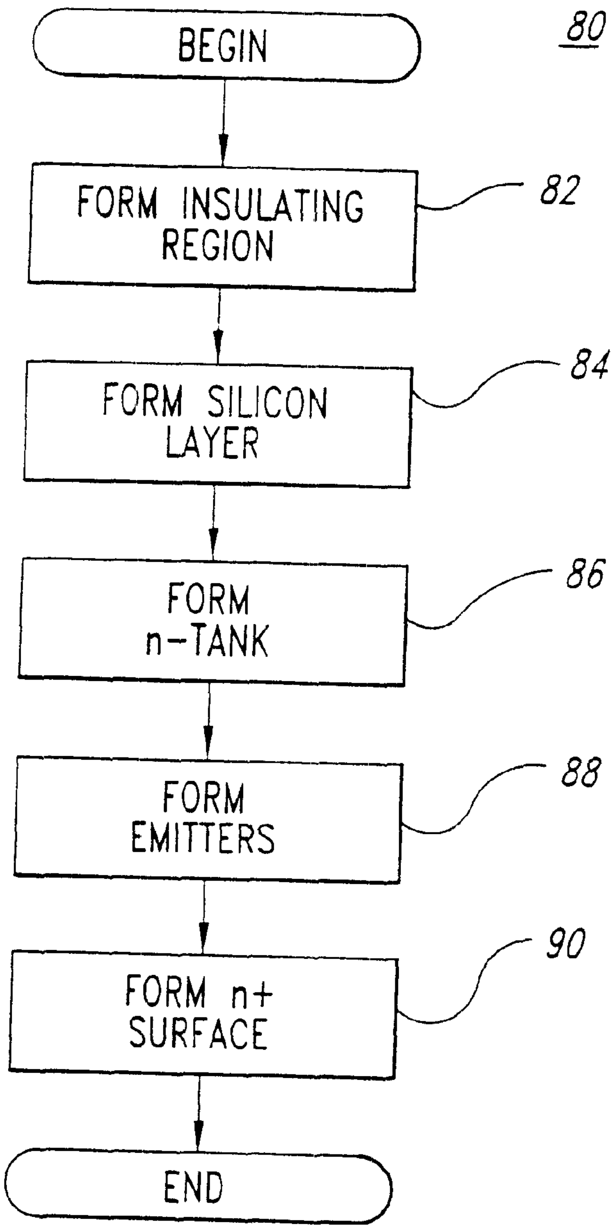
FIG. 3 is a flowchart of a process for providing an insulating region beneath an emitter according to the embodiment of the present invention as described in connection with FIG. 2.

FIG. 3 is a flowchart of a process 80 for providing the insulating region 70 beneath the emitter 30 according to the embodiment of the present invention as described in connection with FIG. 2. In step 82, a conventional SIMOX process is used to form the insulating region 70 by implanting oxygen into the substrate 32. The implantation is carried out at energies of 300 to 500 keV or more to provide a dose of ca. $10^{18}$ per $cm^2$ or more. The substrate 32 is annealed at high temperatures (e.g., greater than 1100° C.) to react the implanted oxygen with the silicon comprising the substrate 32, so that the insulating region 70 is formed of silicon dioxide.

In step 84, a silicon layer, which is p-type in one embodiment, is optionally formed on the substrate 32. In step 86, the n-tank 52' is formed in the p-type substrate 32 via conventional processing, e.g., photolithographic masking followed by implantation and diffusion. In step 88, following suitable masking, the surface of the substrate 32 is conventionally etched to provide the silicon emitter 30. In step 90, the substrate 32 and the silicon emitter are treated to form n+ silicon at the surface. The process 80 then ends and other conventional processing steps for making the display 10' are carried out.

It will be appreciated that the steps of the process 80 may be carried out in a different order than is shown in FIG. 3. For example, the emitters 30 may be formed prior to implanting oxygen to create the insulating region 70, and the n-tank 52' may be formed before or after the oxygen implantation.

Figure 4:
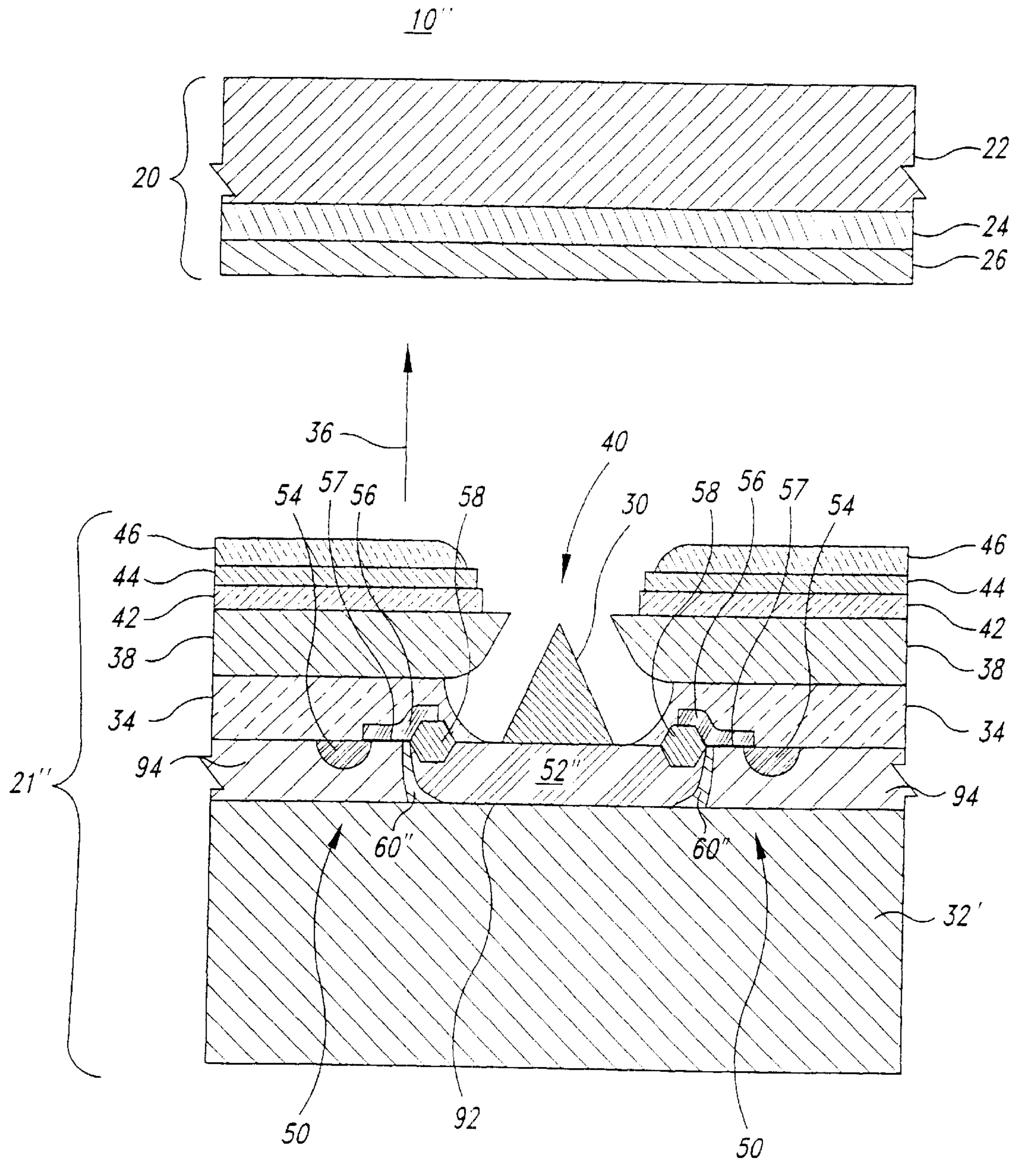
FIG. 4 is a simplified side cross-sectional view of a portion of a display according to another embodiment of the present invention.

FIG. 4 is a simplified side cross-sectional view of a portion of a display 10" according to another embodiment of the present invention. In FIG. 4, the structures above a surface 92 of an insulating substrate 32' are substantially similar to those of FIGS. 1 and 2. Therefore, components that are identical to components shown in FIGS. 1 and 2 have been provided with the same reference numerals, and an explanation of them will not be repeated. The display 10" of FIG. 4 differs from the display 10' of FIG. 2 primarily by forming an n-tank 52" in a p-type silicon layer 94 that is formed on the insulating substrate 32'. This allows the depletion region 60" between the n-tank 52" and the p-type silicon layer 94 (that would normally form beneath the opening 40) to be displaced from the area that can be illuminated by photons traveling through the openings 40 in the extraction grid 38 or through the portions of the extraction grid 38 that are exposed by the openings 40 in the high atomic mass layer 46. This results in an improved baseplate 21". Silicon-on-insulator substrates such as the insulating substrate 32' of FIG. 4 are available from a number of vendors including Aris.

Figure 5:
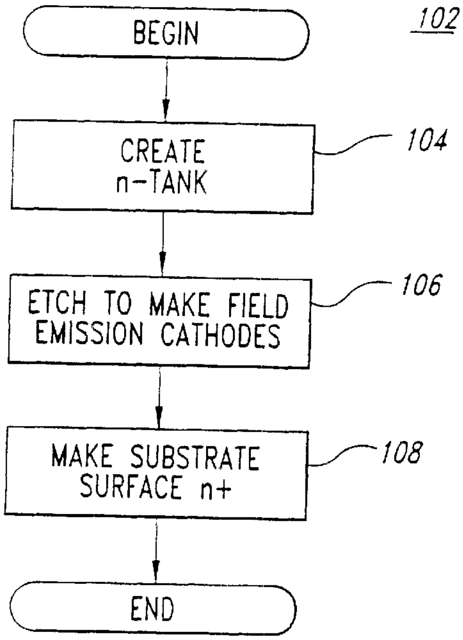
FIG. 5 is a flowchart of a process for providing an insulator beneath the emitter according to the embodiment of the present invention as described in connection with FIG. 4.

FIG. 5 is a flowchart of a process 102 for providing the insulating substrate 32' beneath the emitter 30 and n-tank 52" according to the embodiment of the present invention as described in connection with FIG. 4. The process 102 begins with a step 104 in which the n-tank 52" is formed within the p-type silicon layer 94 via conventional processes, e.g., photolithographic masking followed by implantation and anneal or diffusion. In step 106, following conventional masking, the surface of the p-type silicon layer 94 is conventionally etched to provide the silicon emitter 30. In step 108, the top surface of the p-type silicon layer 94 is treated to form n+ silicon. The process 102 then ends and other conventional processing steps for making a display 10" are carried out.

Figure 6:
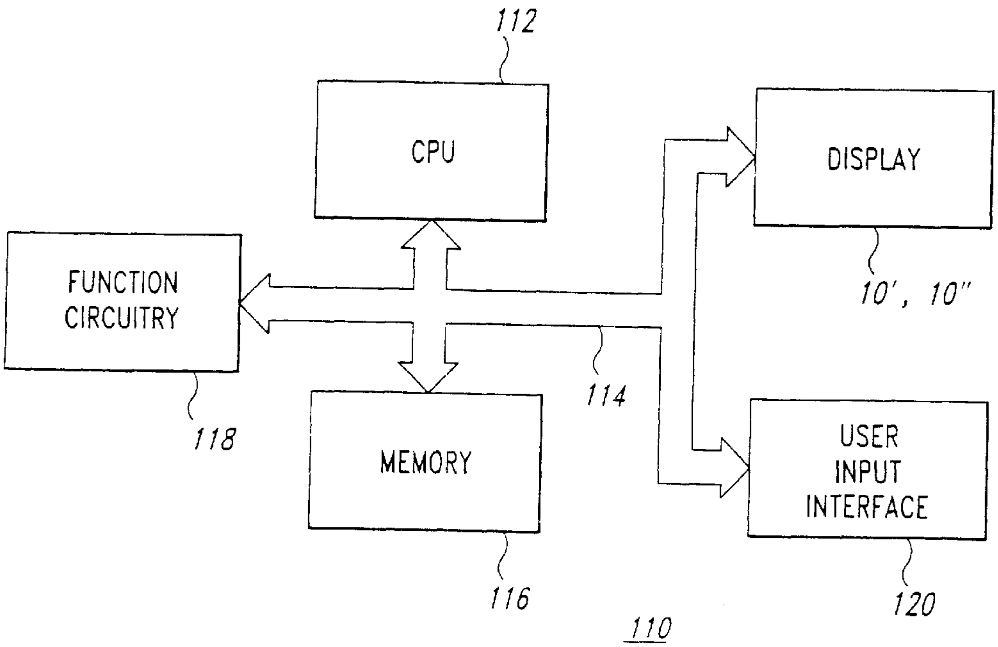
FIG. 6 is a simplified block diagram of a computer using the display according to embodiments of the present invention.

FIG. 6 is a simplified block diagram of a portion of a computer 110 using the display 10' of FIG. 2 or the display 10" of FIG. 4 according to embodiments of the present invention. The computer 110 includes a central processor 112 coupled via a bus 114 to a memory 116, function circuitry 118, a user input interface 120 and the display 10' or 10". The memory 116 may or may not include a memory management module (not illustrated) and does include ROM for storing instructions providing an operating system and a read-write memory for temporary storage of data. The processor 112 operates on data from the memory 116 in response to input data from the user input interface 120 and displays results on the display 10' or 10". The processor 112 also stores and retrieves data in the read-write portion of the memory 116. Examples of systems where such a computer 110 finds application include personal/portable computers, camcorders, televisions, automobile electronic systems, microwave ovens and other home and industrial appliances.

Field emission displays for such applications provide significant advantages over other types of displays, including reduced power consumption, improved range of viewing angles, better performance over a wider range of ambient lighting conditions and temperatures and higher speed with which the display can respond. Field emission displays find application in most devices where, for example, liquid crystal displays find application.

Improved emitter substructures for field emission displays having reduced optical sensitivity have been described. Although the present invention has been described with reference to specific embodiments, the invention is not limited to these embodiments. Rather, the invention is limited only by the appended claims, which include within their scope all equivalent devices or methods which operate according to the principles of the invention as described.

What is claimed is:

1. A method for fabricating a field emission display baseplate, the method comprising:

forming an n-tank within a p-region of semiconductor material, the n-tank being peripherally surrounded by the p-region;

forming an insulator portion beneath the n-tank, the insulator portion electrically isolating only a lower boundary of the n-tank from the p-region so that a depletion region between the n-tank and the p-region is displaced to a peripheral boundary region surrounding the n-tank;

forming an emitter on the n-tank above the insulator portion, the n-tank being substantially bounded by the insulator opposite from the emitter; and forming at least one other layer in which an opening is formed to expose the emitter, the opening being formed over the insulator portion so that the depletion region is at least partially displaced from the area that can be illuminated by photons via the opening.

2. The method of claim 1, further comprising:

forming a source electrode in the p-region;

forming a gate oxide extending from a first area near the source electrode to an area near a junction between the n-tank and the p-region;

forming a gate electrode extending across at least a portion of the gate oxide; and forming a drain comprising the n-tank, wherein the drain, source electrode and gate electrode form a FET.

3. The method of claim 1, further comprising:

forming a dielectric layer on the emitter and the substrate;

forming a conductive layer on the dielectric layer; and forming openings in the conductive and dielectric layers, each of the openings surrounding the emitters such that a tip of the emitter is in close proximity to the conductive layer.

4. The method of claim 3, further comprising:

forming a faceplate having a cathodoluminescent material-coated second surface; and placing the faceplate adjacent the substrate such that the surface is near the tip of the emitter.

5. The method of claim 1 wherein the step of forming an insulator portion includes implanting oxygen into a layer at a lower edge of the n-tank.

6. The method of claim 1, further comprising forming a p-region that is doped to have an acceptor concentration between one to five times $10^{15}$ per $cm^3$.

7. The method of claim 1 wherein the step of forming a n-tank includes forming a n-tank that has a surface donor concentration of about two times $10^{16}$ per $cm^3$.

8. The method of claim 1, further comprising forming a p-region that is doped to have an acceptor concentration between one to five times $10^{15}$ per $cm^3$; and wherein the step of forming a n-tank includes forming a n-tank that has a surface donor concentration of about two times $10^{16}$ per $cm^3$.

9. A method of fabricating a field emission display baseplate, the method comprising:

providing a p-type silicon layer on an insulating substrate;

forming an n-tank within the p-type silicon layer, the p-type silicon layer substantially peripherally surrounding the n-tank, the n-tank having a lower boundary adjacent the insulating substrate;

forming an emitter on the n-tank opposite from the lower boundary adjacent the insulating substrate; and forming at least one other layer in which an opening is formed to expose the emitter, the p-type silicon layer being at least partially displaced from the area that can be illuminated by photons via the opening.

10. The method of claim 9, further comprising:

forming a source electrode in the p-region;

forming a gate oxide extending from a first area near the source electrode to an area near a junction between the n-tank and the p-region;

forming a gate electrode extending across at least a portion of the gate oxide; and forming a drain comprising the n-tank, wherein the drain, source electrode and gate electrode form a FET.

11. The method of claim 9, further comprising:

forming a dielectric layer on the emitter and the substrate;

forming a conductive layer on the dielectric layer; and forming openings in the conductive and dielectric layers, each of the openings surrounding the emitters such that a tip of the emitter is in close proximity to the conductive layer.

12. The method of claim 11, further comprising:

forming a faceplate having a cathodoluminescent material-coated second surface; and placing the faceplate adjacent the substrate such that the surface is near the tip of the emitter.

* * * * *

UNITED STATES PATENT AND TRADEMARK OFFICE
CERTIFICATE OF CORRECTION

PATENT NO. : 6,436,788 B1 
DATED : August 20, 2002
INVENTOR(S) : John K. Lee and Behnam Moradi It is certified that error appears in the above-identified patent and that said Letters Patent is hereby corrected as shown below:

Title page,
Item [57], ABSTRACT,
Line 3, reads “A n-tank” should read -- An n-tank --

Drawings,
Figure 1, reads should read

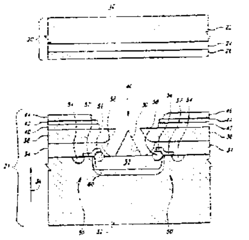

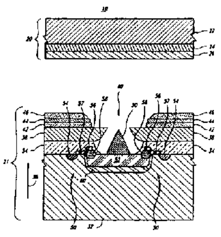

Column 1,
Line 34, reads “phosphor P-56)” should read -- phosphor P-56) --
Line 34, reads “phosphor P-53)” should read -- phosphor P-53) --

Column 6,
Line 22, reads “forming a” should read -- forming an --

Signed and Sealed this

Twenty-seventh Day of May, 2003

JAMES E. ROGAN
*Director of the United States Patent and Trademark Office*